May 23, 1961 V. T. CARBONE ET AL 2,985,774
POLARITY SENSING AMPLIFIER CIRCUIT
Filed Aug. 27, 1959
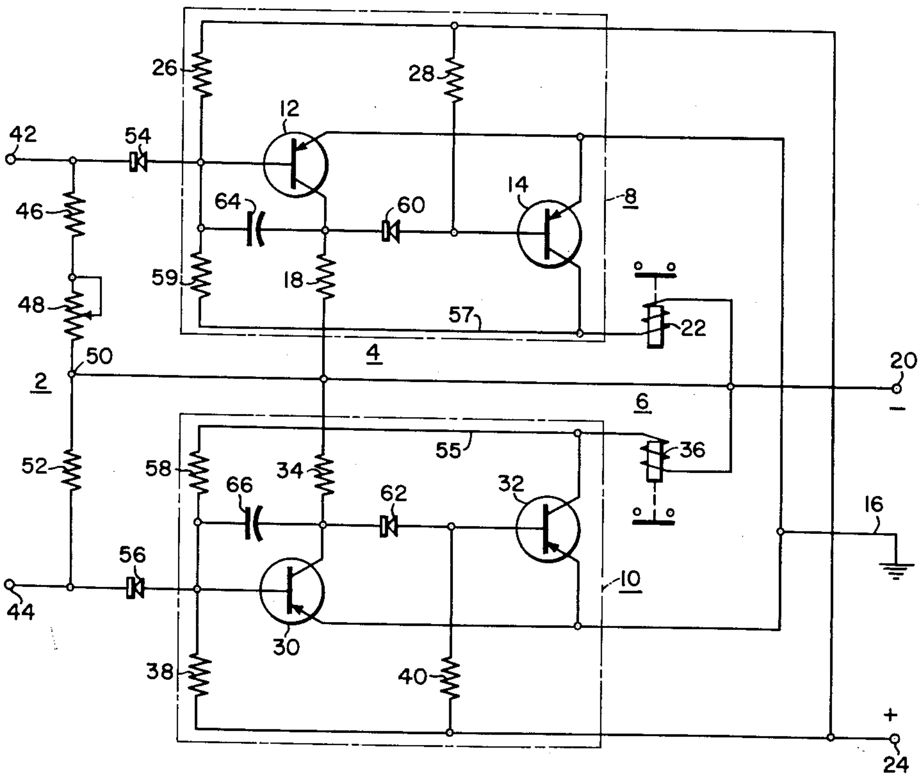
WITNESSES
Edwin E. Barber
James F. Young
INVENTORS
Victor T. Carbone &
Russell D. Clark, Jr.
BY
Paul E. Friedemann
ATTORNEY United States Patent Office 2,985,774

Patented May 23, 1961

2,985,774

POLARITY SENSING AMPLIFIER CIRCUIT

Victor T. Carbone, Buffalo, and Russell D. Clark, Jr., Elma, N.Y., assignors to Westinghouse Electric Corporation, East Pittsburgh, Pa., a corporation of Pennsylvania Filed Aug. 27, 1959, Ser. No. 836,374

6 Claims. (Cl. 307—88.5)

The present invention relates generally to amplifier circuits and more particularly to a bidirectional amplifier circuit of the static type.

An object of the present invention is to provide a static amplifier capable of detecting and magnifying an error signal.

Another object of the present invention is to provide a static amplifier that is sensitive to the polarity of an input signal and is capable of providing an output of sufficient magnitude to energize suitable relay means thereby indicating the polarity of the input signal.

A further object of the present invention is to provide a static amplifier capable of sensing the polarity of an input signal.

Further objects and advantages of the present invention will be readily apparent from the following detailed description taken in conjunction with the drawing in which the sole figure is an electrical schematic diagram of an illustrative embodiment of the invention.

Referring generally to the figure, an input means 2 provides a signal to transistor switching means 4 wherein the signal is amplified for output means 6, shown as relay operating coils, which provides a bidirectional output related to the polarity of the input signal.

The transistor switching circuit 4 comprises a first flip-flop circuit 8 and a second flip-flop circuit 10 operating in a push-pull manner.

The flip-flop amplifier 8 comprises transistors 12 and 14 having commonly connected emitter electrodes grounded at 16. The collector of the transistor 12 is connected through a biasing resistor 18 to a source of negative constant direct current potential indicated at 20, while the collector of the transistor 14 is similarly connected to the negative bias source 20 through a relay operating coil 22, or any other suitable load device. The base electrodes of transistors 12 and 14 are connected to a source of constant positive direct current potential 24 through the biasing resistors 26 and 28, respectively.

In a similar manner, the flip-flop amplifier 10 comprises transistors 30 and 32 having common emitter electrodes grounded at 16. The collector of the transistor 30 is connected to the negative potential source 20 through a resistor 34, while the collector of the transistor 32 is similarly connected to the negative potential source 20 through a relay operating coil 36, or any other suitable load device. The base electrodes of transistors 30 and 32 are connected to the positive potential source 24 through resistors 38 and 40, respectively.

The input means 2 for the switching amplifier 4 is provided with a voltage divider circuit connected across input terminals 42 and 44. The voltage divider circuit comprises a voltage dropping resistor 46, an adjustable resistor 48, junction 50 and a second voltage dropping resistor 52 connected in series circuit relationship across the input terminals 42 and 44. The base electrodes of the transistors 12 and 30 are connected across the voltage divider circuit through rectifier elements 54 and 56 poled to prevent current flow to their respective base electrodes from the input terminals 42 and 44, respectively. The junction 50 of the voltage divider circuit is connected to the negative potential source 20.

The flip-flop amplifiers 8 and 10 are biased in such a manner to initially saturate transistors 12 and 30 thereby similating switches in the closed position; while the transistors 14 and 32 are unsaturated, similating switches in the open position. In the absence of an input signal to the terminals 42 and 44 the collector electrodes of the transistors 12 and 30 will be at substantially ground potential. Thus, the base electrodes of the transistors 14 and 32 will be of positive potential with respect to their collector and emitter electrodes and the relay coils 22 and 36 will not be energized.

Transistors of the P-N-P type have been illustrated but it is to be understood that transistors of the N-P-N type may be used with suitable changes in the polarity of the circuit.

If an input signal is applied causing the terminal 44 to be positive with respect to the terminal 42, the transistor 12 will merely be forced to become more conductive as its base electrode will be driven more negative with respect to its collector electrode. Hence, the collector electrode of the transistor 12 remains near ground potential and the transistor 14 continues to similate a switch in the open position. However, the blocking action of the rectifier element 56 does not allow current to flow to the base electrode of the transistor 30, but rather causes current to flow through the voltage dropping resistor 52 of the voltage divider circuit. The potential of the junction 50 is thus driven more negative. The collector electrode of the transistor 30 is also forced more negative with respect to its base electrode forcing the transistor 30 further toward cut-off, similating a switch in the open position. As a result, the base electrode of the transistor 32 becomes negative with respect to its collector causing the transistor 32 to saturate, similating a switch in the closed position connecting the operating relay coil 36 across the negative potential source 20 to ground 16.

A resistor 58 connecting the collector electrode of the transistor 32 to the base electrode of the transistor 30 provides a positive feedback line 55 for the flip-flop amplifier 10 ensuring snap action across the relay coil 36.

When the input signal is removed, the junction 50 returns to the initial negative potential determined by the negative source 20 and the operating coil 36 is deenergized returning the circuit to its original "no output" state.

If an input signal is applied such that terminal 42 is rendered positive with respect to terminal 44, the switching amplifier 4 will operate in a similar manner as previously described. The base electrode of the transistor 30 will be driven more negative causing the transistor 30 to become more saturated thereby forcing the transistor 32 to remain unsaturated similating a switch in the open position. The blocking action of the rectifier element 54 forces current through the voltage dropping resistor 46 and adjustable resistor 48 causing the junction 50 to become more negative with the result that the transistor 12 is driven towards unsaturation and transistor 14 will become saturated. The operating relay coil 22 is thereby connected across the negative potential source 20 to ground 16. A resistor 59 for amplifier 8 is connected through positive feedback line 57 in a similar manner as resistor 58 in amplifier 10 for snap action of the relay coil 22.

Rectifying elements 60 and 62 for each flip-flop amplifier 8 and 10, respectively, connect the base electrode of the transistor 14 to the collector electrode of the transistor 12 in the amplifier 8 while the base electrode of the transistor 32 is connected to the collector electrode of the transistor 30 in the amplifier 10. The rectifying elements 60 and 62 are chosen to have a sufficient voltage drop in the forward direction to ensure that the transistors 14 and 32 may become unsaturated without excessive current drain through the biasing resistors 28 and 40, respectively.

Capacitor 64 and 66 connected across the base-collector circuit of the transistors 12 and 30, respectively, prevent oscillation of the amplifiers 8 and 10 from "on" to "off" conditions upon occurrence of rapid switching.

Adjustment of the variable resistor 48 allows compensation for inherent differences in the circuit parameters to obtain unsaturation or "cut-off" of the output transistors 14 and 32.

Thus, a bidirectional sensing amplifier has been provided capable of providing an output related to the polarity of the input signal to the amplifier.

While a specific embodiment of the present invention has been shown for the purposes of illustration, it is to be understood that further modifications, alterations and additions within the spirit and scope of the invention are herein meant to be included. For instance, the input signal to the terminals 42 and 44 may be provided by a detector bridge wherein the input terminals are connected to the sliders of potentiometers connected in a detector bridge arrangement. One slider may be arranged to be manually positioned as a target while the other slider is driven by the output of the bidirectional sensing amplifier to track the manually operated target in an automatic manner. Through utilization of two bidirectional sensing amplifiers such as illustrated, a motor control system combining both fast and slow speeds may be obtained wherein the high speed is employed to obtain fast tracking of the target while the slow speed makes it possible to approach the target position without hunting or undesirable motor oscillations. By inserting a potentiometer in series with the input of the amplifier controlling the high speed, drop-out and pull-in speed points for the control circuit may be adjusted to obtain the desired two speed effect since the high speed can be made to drop out before balance is obtained. This leaves the slower speed to accomplish complete balance between the target and the tracking member.

We claim as our invention:

1. A bidirectional sensing amplifier comprising input means for receiving a signal and including a voltage divider circuit with a tap intermediate the ends thereof; a first transistor and a second transistor each having a base, collector, and emitter; a first rectifier connecting the base of said first transistor to one end of said voltage divider; a second rectifier connecting the base of said second transistor to the other end of said voltage divider; the collector of each transistor commonly connected to said tap; direct current means for biasing said first and second transistor to saturation; each said rectifier poled to block current flow to its associated base in response to a predetermined polarity of said signal thereby forcing current flow in said voltage divider circuit, said tap potential changing in response to such flow rendering unsaturated the transistor associated with the rectifier which is blocking; and means responsive to the unsaturation of said transistors for providing an output.

2. A bidirectional sensing amplifier comprising input means for receiving a signal and including a voltage divider circuit with a tap intermediate the ends thereof; a first transistor and a second transistor each having a base, collector, and emitter; a first rectifier connecting the base of said first transistor to one end of said voltage divider; a second rectifier connecting the base of said second transistor to the other end of said voltage divider; the collector of each transistor commonly connected to said tap; direct current means for biasing said first and second transistor to saturation; each said rectifier poled to block current flow to its associated base in response to a predetermined polarity of said signal thereby forcing current flow in said voltage divider circuit to alter the relative polarity of the collector-base circuit of the associated transistor.

3. A bidirectional sensing amplifier comprising input means for receiving a signal and including a voltage divider circuit with a tap intermediate the ends thereof, a first transistor and a second transistor each having a base, collector, and emitter; a first rectifier connecting the base of said first transistor to one end of said voltage divider; a second rectifier connecting the base of said second transistor to the other end of said voltage divider; the collector of each transistor commonly connected to said tap; direct current means for biasing said first and second transistor to saturation; each said rectifier poled to block current flow to its associated base in response to a predetermined polarity of said signal thereby forcing current flow in said voltage divider circuit, said tap potential changing in response to such flow rendering unsaturated the transistor associated with the rectifier which is blocking; and means responsive to the unsaturation of said transistors for providing an output; a portion of said output being fedback to said base of the unsaturated transistor.

4. A bidirectional sensing amplifier comprising input means for receiving a signal and including a voltage divider circuit with a tap intermediate the ends thereof; a first transistor and a second transistor each having a base, collector, and emitter; a first rectifier connecting the base of said first transistor to one end of said voltage divider; a second rectifier connecting the base of said second transistor to the other end of said voltage divider; the collector of each transistor commonly connected to said tap; direct current means for biasing said first and second transistor to saturation; each said rectifier poled to block current flow to its associated base in response to a predetermined polarity of said signal thereby forcing current flow in said voltage divider circuit, said tap potential changing in response to such flow rendering unsaturated the transistor associated with the rectifier which is blocking; and means responsive to the unsaturation of said transistors for providing an output; a portion of said output being fedback to said base of the unsaturated transistor; capacitor means for each transistor bridging the respective base-collector circuit of said each transistor.

5. A bidirectional sensing amplifier comprising input means for receiving a signal and including a voltage divider circuit with a tap intermediate the ends thereof; a first transistor and a second transistor each having a base, collector, and emitter; a first rectifier connecting the base of said first transistor to one end of said voltage divider; a second rectifier connecting the base of said second transistor to the other end of said voltage divider; the collector of each transistor commonly connected to said tap; direct current means for biasing said first and second transistor to saturation; each said rectifier poled to block current flow to its associated base in response to a predetermined polarity of said signal thereby forcing current flow in said voltage divider circuit, said tap potential changing in response to such flow rendering unsaturated the transistor associated with the rectifier which is blocking; means responsive to the unsaturation of said transistors for providing an output; a portion of said output being fedback to said base of the unsaturated transistor; capacitor means for each transistor bridging the respective base-collector circuit of said each transistor; and means for adjusting the impedance of the voltage divider circuit.

6. A bidirectional sensing amplifier comprising input means for receiving a signal and including a voltage divider circuit with a tap intermediate the ends thereof; a first transistor and a second transistor each having a base, collector, and emitter; a first rectifier connecting the base of said first transistor to one end of said voltage divider; a second rectifier connecting the base of said second transistor to the other end of said voltage divider; the collector of each transistor commonly connected to said tap; direct current means for biasing said first and second transistor to saturation; each said rectifier poled to block current flow to its associated base in response to a predetermined polarity of said signal thereby forcing current flow in said voltage divider circuit to alter the relative polarity of the collector-base circuit of the associated transistor, said tap potential changing in response to such flow rendering unsaturated the transistor associated with the rectifier which is blocking; means responsive to the unsaturation of said transistors for providing an output; a portion of said output being fedback to said base of the unsaturated transistor; capacitor means for each transistor bridging the respective base-collector circuit of said each transistor; and means for adjusting the impedance of the voltage divider circuit.

References Cited in the file of this patent

UNITED STATES PATENTS

| | | |
|---|---|---|
| 2,698,392 | Herman | Dec. 28, 1954 |
| 2,809,303 | Collins | Oct. 8, 1957 |
| 2,840,727 | Guggi | June 24, 1958 |
| 2,877,357 | Pearshall | Mar. 10, 1959 |
| 2,907,932 | Patchell | Oct. 6, 1959 |

FOREIGN PATENTS

| | | |
|---|---|---|
| 764,154 | Great Britain | Dec. 19, 1956 |